(12) United States Patent
Choi et al.

(10) Patent No.: US 8,872,168 B2
(45) Date of Patent: *Oct. 28, 2014

(54) FLEXIBLE ORGANIC LIGHT EMITTING DISPLAY AND METHOD IN AN IN-CELL STRUCTURE HAVING A TOUCH ELECTRODE ARRAY FOR MANUFACTURING THE SAME

(71) Applicant: LG Display Co., Ltd., Seoul (KR)

(72) Inventors: Ho-Won Choi, Daegu (KR); Jin-Yeol Kim, Sangju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/725,434

(22) Filed: Dec. 21, 2012

(65) Prior Publication Data

US 2014/0042398 A1    Feb. 13, 2014

(30) Foreign Application Priority Data

Aug. 13, 2012    (KR) .................. 10-2012-0088540

(51) Int. Cl.
| | | |
|---|---|---|
| *H01L 29/08* | (2006.01) | |
| *H01L 51/50* | (2006.01) | |
| *H01L 27/32* | (2006.01) | |
| *G06F 3/041* | (2006.01) | |
| *G06F 3/044* | (2006.01) | |
| *H01L 51/56* | (2006.01) | |
| *H01L 33/08* | (2010.01) | |
| *H01L 51/52* | (2006.01) | |

(52) U.S. Cl.
CPC ............ *H01L 51/50* (2013.01); *H01L 27/3244* (2013.01); *G06F 3/0412* (2013.01); *G06F 3/044* (2013.01); *H01L 51/5237* (2013.01); *H01L 51/56* (2013.01); *H01L 33/08* (2013.01)
USPC .. 257/40; 257/88; 257/E51.001; 257/E51.019

(58) Field of Classification Search
CPC ...... H01L 51/50; H01L 33/08; H01L 27/3244
USPC .................. 257/40, 88, E51.001, E51.019
See application file for complete search history.

(56) References Cited

U.S. PATENT DOCUMENTS

| | | | |
|---|---|---|---|
| 2014/0061597 A1* | 3/2014 | Choi et al. ................ | 257/40 |
| 2014/0062909 A1* | 3/2014 | Choi et al. ................ | 345/173 |
| 2014/0078077 A1* | 3/2014 | Choi ....................... | 345/173 |

FOREIGN PATENT DOCUMENTS

| | | |
|---|---|---|
| JP | 2006-231644 | 9/2006 |
| JP | 2009-090634 | 4/2009 |
| JP | 2012-099083 | 5/2012 |
| WO | WO 2012/077320 A1 | 6/2012 |

OTHER PUBLICATIONS

Office Action issued in corresponding Japanese Patent Application No. 2012-284226, mailed Feb. 27, 2014, 4 pages.

* cited by examiner

*Primary Examiner* — Andy Huynh

(74) *Attorney, Agent, or Firm* — Brinks Gilson & Lione

(57) ABSTRACT

Disclosed are an organic light emitting display that enables realization of a thin film shape and flexibility, and exhibits superior contact properties in touch pads based on an improved structure, and a method for manufacturing the same, wherein a distance between the outermost surface of the touch pad portion and the outermost surface of the dummy pad portion in the touch pad portion is smaller than the distance in a neighboring portion adjacent to the touch pad portion.

25 Claims, 13 Drawing Sheets

FLEXIBLE ORGANIC LIGHT EMITTING DISPLAY AND METHOD IN AN IN-CELL
STRUCTURE HAVING A TOUCH
ELECTRODE ARRAY FOR
MANUFACTURING THE SAME

CROSS-REFERENCE TO RELATED APPLICATIONS

This application claims the benefit of Korean Patent Application No. 10-2012-0088540, filed on Aug. 13, 2012, which is hereby incorporated by reference as if fully set forth herein.

FIELD

The present invention relates to an organic light emitting display, and more particularly, to an organic light emitting display that enables realization of a thin film shape and flexibility, and exhibits superior contact properties in touch pads based on an improved structure, and a method for manufacturing the same.

BACKGROUND

Examples of flat panel displays include liquid crystal displays (LCDs), organic light emitting displays (OLEDs), plasma display panels (PDPs), quantum dot panels (PDPs), field emission displays (FEDs), electrophoretic displays (EPDs) and the like. These displays include a flat display panel realizing an image in common as an essential component. Such a flat display panel has a configuration in which a pair of transparent insulating substrates are joined together such that they face each other via a layer containing an inherently luminescent or polarizing material or other optical material interposed therebetween.

In accordance with the recent trend toward large-size displays, demand for flat panel displays taking a smaller space gradually increases. Of these flat panel displays, organic light emitting display technologies are being rapidly developed.

Organic light emitting displays do not require any separate light source and include an organic light emitting diode that spontaneously emits light in each pixel, to realize display. The organic light emitting displays attract much attention as next-generation displays since they advantageously do not require light sources as well as structures for assembling the light sources with a display panel, thus having advantages of decrease in thickness and weight.

When electric charges are injected into an organic film formed between an electron injection electrode (cathode) and a hole injection electrode (anode), electrons pair with holes and the pairs then decay. At this time, an organic light emitting diode emits light.

Meanwhile, there is an increasing demand for incorporating a touchscreen into an organic light emitting display, where a site touched by the hand or separate input element is sensed and information is transferred in response thereto. Such a touchscreen is being applied by adhesion to the outer surface of the display.

Depending on touch sense methods, a touchscreen may be of resistive, capacitive and infrared sensing types. In consideration of ease of manufacture, sensing force and the like, capacitive type touchscreens attract much attention in small models.

Hereinafter, a touchscreen-integrated organic light emitting display of related art will be described with reference to the annexed drawings.

FIG. 1 is a sectional view illustrating a touchscreen organic light emitting display of related art.

As shown in FIG. 1, the touchscreen-integrated organic light emitting display includes an organic light emitting display panel 1, a touchscreen 2 and a cover window 3 laminated in this order from the bottom and includes first and second adhesive layers 15 and 25 disposed between the respect layers.

Here, the organic light emitting display panel 1 includes a substrate, a thin film transistor array having a matrix form disposed on the substrate, and an organic light emitting diode connected to each thin film transistor of the thin film transistor array, and includes a protective film and a polarizing layer that cover the top of the organic light emitting diode. In this case, the first adhesive layer 15 corresponds to the polarizing layer of the organic light emitting display panel 1.

The touchscreen-integrated organic light emitting display of related art has the following disadvantages.

First, when an organic light emitting display panel and a touchscreen are independently formed, and the touchscreen is then attached to the organic light emitting display panel, the organic light emitting display panel and the touchscreen require separate glasses, thus resulting in increased hardness and thickness, and making realization of thin and flexible organic light emitting displays impossible.

Second, the organic light emitting display panel and the touchscreen have different panel shapes, thus making processes for forming these components complicated and thus decreasing yield and price competiveness.

Third, if the touchscreen is configured as an in-cell type, a pad portion of the touchscreen faces an inside, that is, a side of a pad portion of an organic light emitting display panel. In this case, a bonding process is performed using a sealant including conductive balls. Herein, relatively small conductive balls may have contact defects due to difference in diameter between the normal conductive balls. Also, a compression level of conductive balls is changed depending on a pressure applied during bonding and contact defects may thus occur during the bonding process.

SUMMARY

Accordingly, the present disclosure is directed to an organic light emitting display and a method for manufacturing the same that substantially obviate one or more problems due to limitations and disadvantages of the related art.

An object of the present disclosure is to provide an organic light emitting display that enables realization of a thin film shape and flexibility, and exhibits superior contact properties in touch pads based on an improved structure, and a method for manufacturing the same.

Additional advantages, objects, and features of the present disclosure will be set forth in part in the description which follows and in part will become apparent to those having ordinary skill in the art upon examination of the following or may be learned from practice of the invention. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, provided is an organic light emitting display including: a first buffer layer and a second buffer layer having an active region and a dead region and facing each other; a thin film transistor array including a thin film transistor in each of a plurality of pixels defined in a matrix form on the active region of the first buffer layer; an organic light emitting diode connected to each thin film transistor at each pixel; a protective layer formed on the first buffer layer such that the protective layer covers the thin film transistor array and the organic light emitting diode; a touch electrode array formed on the active region of the second buffer layer; an adhesive layer contacting the protective layer and the touch electrode array, respectively; a touch pad portion formed on a part of the dead region of the second buffer layer; a dummy pad portion facing the touch pad portion on the dead region of the first buffer layer; and a sealant including a plurality of conductive balls between the touch pad portion and the dummy pad portion, wherein a distance between the outermost surface of the touch pad portion and the outermost surface of the dummy pad portion in the touch pad portion is smaller than the distance in a neighboring portion adjacent to the touch pad portion.

Also, the touch pad portion may include a plurality of touch pad electrodes spaced from one another, the dummy pad portion may comprise a plurality of dummy electrodes corresponding to the touch pad electrodes.

The conductive balls may be compressed to a predetermined thickness between the touch pad portion and the dummy pad portion.

The dead region of the neighboring portion may be spaced from the sealant by a predetermined distance.

Meanwhile, the touch pad electrode may have a laminate structure including: a metal pattern; a transparent electrode pattern overlapping the metal pattern; and at least one interlayer insulating film disposed between the metal pattern and the transparent electrode pattern.

Here, at least one interlayer insulating film may be an organic film.

Also, the touch electrode array may include: a metal bridge formed in the same layer as the metal pattern on the second buffer layer; a plurality of first transparent channel electrodes electrically connected to the metal bridge while overlapping the metal bridge in the same layer as the transparent electrode pattern, the first transparent channel electrodes being spaced in a first direction; and a second transparent channel electrode formed in a second direction while traversing the metal bridge in the same layer as the first transparent channel electrode.

Also, the touch pad electrode may further include a common transparent electrode pattern that is connected to the transparent electrode pattern and overlaps the same.

In this case, the organic light emitting display may further include a common transparent electrode in the same layer as the common transparent electrode pattern such that the common transparent electrode covers the first transparent channel electrode and the second transparent channel electrode.

Also, the organic light emitting display may further include a first interlayer insulating film between the metal bridge and a layer of the first transparent channel electrode and the second transparent channel electrode; and a second interlayer insulating film formed between the common transparent electrode and the layer of the first transparent channel electrode and the second transparent channel electrode.

At least one interlayer insulating film may be removed from the dead region of the neighboring portion.

Also, the first interlayer insulating film may be removed from a region excluding the metal bridge intersecting the second transparent electrode channel and the touch pad electrode.

Meanwhile, the dummy electrode may include a gate insulating film, a gate electrode layer, an intermediate insulating film and a source metal layer laminated on the first buffer layer.

Also, the organic light emitting display may further include a first etching stopper and a second etching stopper film formed on the back surfaces of the first buffer layer and the second buffer layer, respectively. In this case, the organic light emitting display may further include a film substrate formed on the back surface of the first etching stopper film.

Also, the organic light emitting display may further include a cover glass formed on a back surface of the second etching stopper film.

Meanwhile, the first buffer layer and the second buffer layer may have a laminate structure including a plurality of inorganic films.

Also, the film substrate may be a plastic insulating film.

Also, the first etching stopper film and the second etching stopper film may include polyimide or photoacryl.

In accordance with another aspect of the present invention, provided is a method for manufacturing an organic light emitting display including: forming a first etching stopper film and a first buffer layer on a first substrate, forming a thin film transistor array including a thin film transistor in each of a plurality of pixels defined in a matrix form, an organic light emitting diode connected to each thin film transistor at each pixel, and a protective layer formed on the first buffer layer such that the protective layer covers the thin film transistor array and the organic light emitting diode, in the active region of the first buffer layer, and forming a dummy pad portion on the dead region of the first buffer layer; forming a second etching stopper film and a second buffer layer on a second substrate, forming a touch electrode array in the active region of the second buffer layer, forming a touch pad portion in a region corresponding to the dummy pad portion; and applying a sealant including conductive balls to the touch pad portion or the dummy pad portion, attaching an adhesive layer to the touch electrode array or the protective layer and performing a joining process, wherein a distance between the outermost surface of the touch pad portion and the outermost surface of the dummy pad portion in the touch pad portion is smaller than the distance in a neighboring portion adjacent to the touch pad portion.

After the joining process, the conductive balls may be compressed to a predetermined thickness between the touch pad portion and the dummy pad portion.

After the joining process, the dead region of the touch pad portion neighboring portion may be spaced from the sealant by a predetermined distance.

The method may further include: removing the first substrate and the second substrate; and attaching a film substrate to an exposed surface of the first etching stopper film.

The removing the first substrate and the second substrate may be carried out by etching or laser-irradiating the first substrate and the second substrate.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the present disclosure and are incorporated in and constitute a part of this application, illustrate embodiment(s) of the invention and simultaneously with the description serve to explain the principle of the invention. In the drawings.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

Hereinafter, an organic light emitting display and a method for manufacturing the same will be described in detail with reference to the annexed drawings.

An organic light emitting display according to the present disclosure has a touch sensing function and has a reduced thickness and increased flexibility. According to the present disclosure, a thin film transistor and an organic light emitting array are formed on a first substrate, whereas a touch electrode array is formed on a second substrate. The first and second substrates are joined together, followed by removing the hard and thick first and second substrates by laser irradiation or etching to reduce thickness and to increase flexibility. In the organic light emitting display according to the present disclosure, a pad portion of the touch electrode array faces a pad portion of the organic light emitting array, and these pad portions are connected to each other via a conductive ball to allow for transfer of signals to the touch electrode array and detection of signals from the touch electrode array.

Hereinafter, an in-cell organic light emitting display in which a touch electrode array is provided inside a cover glass will be described.

Figure 1:
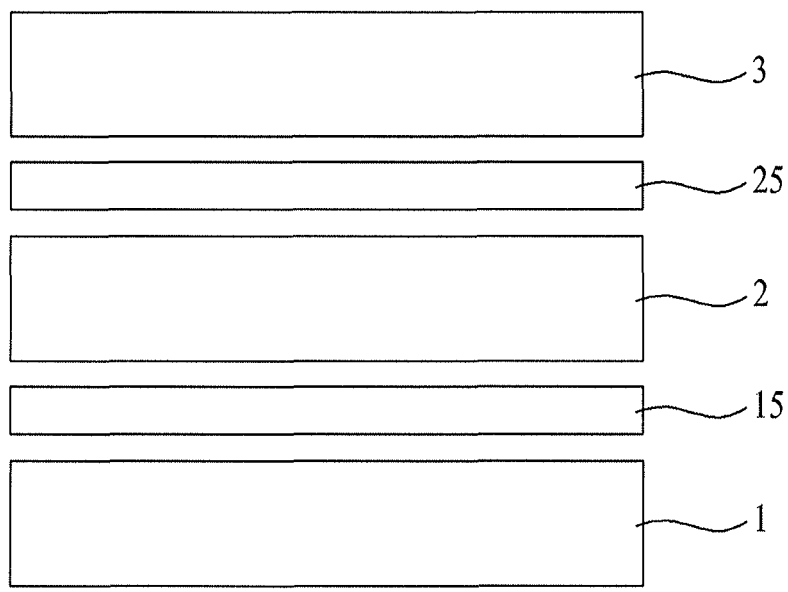
FIG. 1 is a sectional view illustrating a touchscreen-integrated organic light emitting display of related art.
Figure 2:
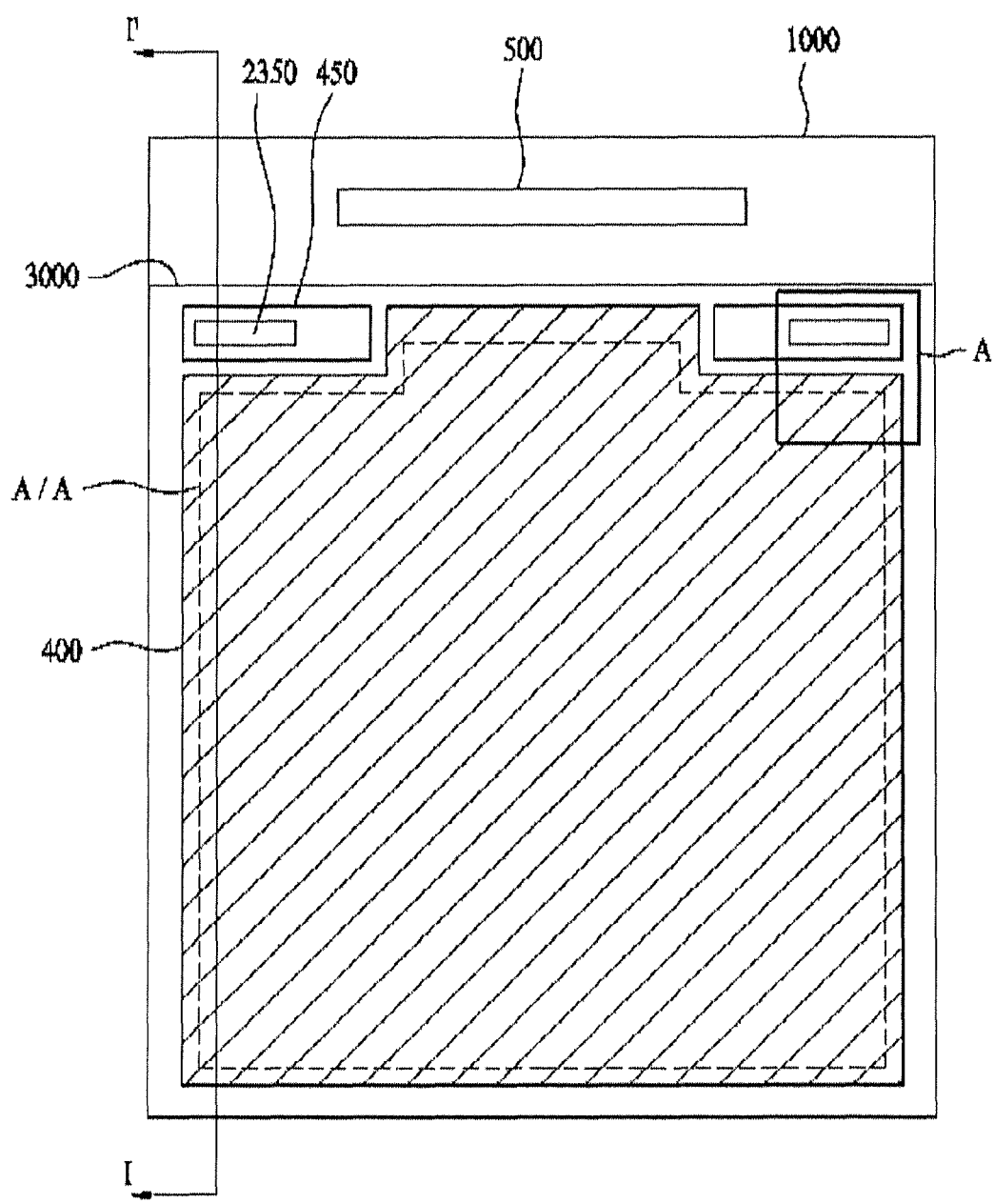
FIG. 2 is a plan view illustrating an organic light emitting display according to the present disclosure.
Figure 3:
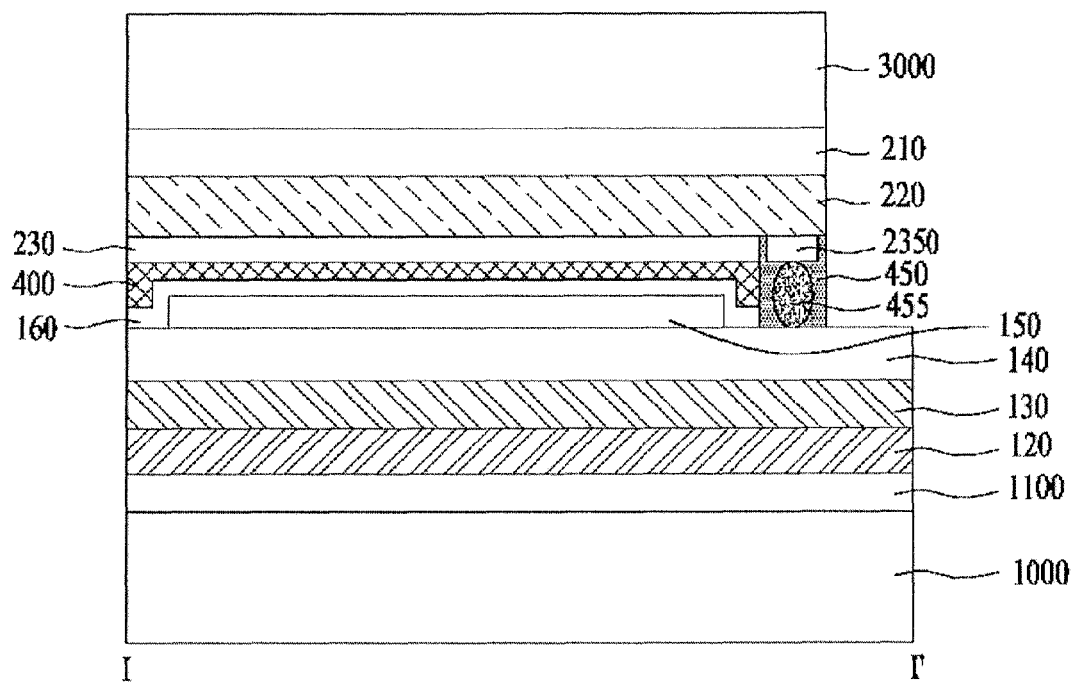
FIG. 3 is a cross-sectional view taken along the line I-I' of FIG. 2.

FIG. 2 is a plan view illustrating an organic light emitting display according to the present disclosure. FIG. 3 is a cross-sectional view taken along the line I-I' of FIG. 2.

As shown in FIGS. 2 and 3, the organic light emitting display according to the present disclosure includes an organic light emitting array 150 and a touch electrode array 230 that are joined to each other via an adhesive layer 400. The organic light emitting array 150 and the touch electrode array 230 have different sizes, and are formed at an inside of a film substrate 1000 and at an inside of a cover glass 3000, respectively.

The organic light emitting array 150 and the touch electrode array 230 are not directly formed on the film substrate 1000 or the cover glass 3000. Instead, these arrays are formed by separately preparing first and second substrates (both not shown) made of glass, followed by joining the substrates via an adhesive layer disposed between the organic light emitting array 150 and the touch electrode array 230. The joining of the substrates is performed while keeping the first and second substrates. Thereafter, the first and second substrates are removed by laser irradiation or etching to achieve thin film and flexibility. In this case, as shown in FIG. 2, the first and second substrates formed of glass materials are removed and the film substrate 1000 and the cover glass 3000 are adhered to the bottom of the exposed arrays, respectively, in order to protect these arrays.

Here, a film adhesive layer 1100, a first etching stopper layer 120, a first buffer layer 130 and a thin film transistor array 140 and an organic light emitting array 150 are formed on the film substrate 1000 in this order. A protective layer 160 is formed to cover the organic light emitting array 150. A second etching stopper layer 210, a second buffer layer 220 and a touch electrode array 230 are disposed on the cover glass 3000. Here, the touch electrode array 230 is disposed to face the organic light emitting array 150. As shown in the illustrative embodiment, the protective layer 160 directly contacts a bottom surface of the adhesive layer 400 and the touch electrode array 230 directly contacts a top surface of the adhesive layer 400.

An active region and a dead region are defined in each of the first buffer layer 130 and the second buffer layer 220. The touch electrode array 230, the organic light emitting array 150 and thin film transistors present in the thin film transistor array 140 excluding a pad portion are formed in the active region. The touch electrode pad portion 2350 and the pad portion of the thin film transistor array are defined in part of the dead region.

The first etching stopper layer 120 and the second etching stopper layer 210 function to prevent damage to an internal array, in addition to the first and second substrates made of glass materials during laser irradiation or etching.

Also, the first buffer layer 130 and the second buffer layer 220 may be formed by sequentially laminating the same type of inorganic film such as an oxide film ($SiO_2$) or nitride film (SiNx), or alternatively laminating different types of inorganic films. The first and second buffer layers 130 and 220 serve as barriers to prevent permeation of moisture or exterior air into the organic light emitting array 150 after the second substrate is joined to the first substrate.

Also, both the touch pad portion 2350 and the touch electrode array 230 are formed on the same surface of the second buffer layer 220.

The touch pad portion 2350 is connected to the pad portion of the thin film transistor array 140 via a sealant 450 including a conductive ball 455, when the upper and lower substrates are joined to each other via the adhesive layer 400. The adhesive layer 400 functions to prevent permeation of moisture and directly contacts the protective layer 160 that covers the organic light emitting array 150, thus preventing permeation of exterior air into the organic light emitting array 150 and more certainly prevents permeation of moisture, in addition to the functions of the protective layer 160.

Here, the thin film transistor array 140 including the pad portion has a side that protrudes from the touch electrode array 230. This configuration aims at providing, at the protrusion, an IC 500 (not shown) that transfers a signal to simultaneously drive the touch electrode array and the thin film transistor array, and the organic light emitting array. Although not shown, the IC 500 is connected through lines (not shown) formed on the IC 500 and the first buffer layer 130 to driving pads and dummy pads of the thin film transistor array. Also, the IC 500 is bonded and connected to a flexible printed circuit board (FPCB, not shown) and may be controlled by a controller (not shown) provided in the FPCB. The dummy pad is formed in the same layer as a metal constituting a gate or data line in a region corresponding to the touch pad portion among the dead region disposed out of the active region.

The touch pad portion 2350 is formed on the second buffer layer 220 and is formed at both edges of the side adjacent to a portion where the first buffer layer 130 protrudes more than the second buffer layer 220. Also, the touch pad portion 2350 formed at one edge is divided into a plurality of pad electrodes to enable voltage application or detection of first electrodes arrayed in an X-axis direction in the touch electrode array, and the touch pad portion 2350 formed at the other edge is divided into a plurality of pad electrodes to enable voltage application or detection of second electrodes arrayed in an Y-axis direction.

The conductive ball 455 connected to the touch pad portion 2350 is electrically connected to a dummy electrode (not shown) formed out of the thin film transistor array 140.

Meanwhile, as shown in FIG. 3, the organic light emitting display according to the present disclosure includes a film substrate 1000, a first etching stopper film 120 and a first buffer layer 130 formed in this order on the film substrate 1000, a thin film transistor array 140 having a thin film transistor in each pixel defined in a matrix form on the first buffer layer 130, an organic light emitting array 150 connected to the thin film transistor of each pixel, a protective layer 160 that covers the thin film transistor array 140 excluding the pad portion and the organic light emitting array 150, a touch electrode array 230 adhered to the protective layer via an adhesive layer 400 interposed between the protective layer 160 and the touch electrode array 230, and a second buffer layer 220 and a second etching stopper film 210 formed in this order on the touch electrode array 230, and includes a cover glass 3000 disposed on the second etching stopper film 210.

Here, the cover glass 3000 may be adhered to the second etching stopper film 210 via an adhesive layer therebetween, or may be disposed on the second etching stopper film 210 by a mechanical method or another method. The cover glass 3000 protects internal arrays from damage caused by direct touch of a user.

The organic light emitting display according to the present disclosure can have reduced thickness by omitting a glass substrate, which has a thickness of about 0.7 mm, which is the thickest among components in the display, and which would otherwise increase the overall thickness of the organic light emitting display. Moreover, the organic light emitting can realize a bendable or flexible display by using a plastic insulating film as the film substrate 1000 to support the thin film transistor array 140, the organic light emitting array 150 and the touch electrode array 230.

In addition, in the process of forming arrays such as the thin film transistor array 140, the organic light emitting array 150 and the touch electrode array 230 on the film substrate, the film substrate may be thermally expanded by heat applied to apparatuses for depositing or patterning the arrays, thus making normal processing impossible. In order to prevent this phenomenon, formation of arrays is carried out by forming etching stopper films 120 and 210 and buffer layers 130 and 220 under the thin film transistor array 140 and the touch electrode array 230, respectively, on the glass substrate, before formation of the thin film transistor array 140 and formation of the touch electrode array 230, and then loading the glass substrate in an apparatus for deposition or patterning.

Meanwhile, the thin film transistor array 140 includes a plurality of gate lines and a plurality of data lines that intersect each other to define pixels. The thin film transistors are formed at the respective intersections between the gate lines and the data lines. A pad portion of the thin film transistor array 140 is obtained by forming a pad portion metal in the process of forming the gate and data lines.

Also, the organic light emitting array 150 includes a first electrode formed at least in the pixel, a second electrode formed in an upper layer spaced from the first electrode, and an organic light emitting layer formed between the first and second electrodes. Here, the first electrode may be connected to a drain electrode of the thin film transistor.

In addition, the first etching stopper film 120 and the second etching stopper film 210 may be for example formed of polyimide or photo-acryl.

The first and second etching stopper films 120 and 210 have a thickness of about 1 µm to about 20 µm.

Also, the first buffer layer 130 and the second buffer layer 220 function to prevent permeation of oxygen or moisture into organic films provided in the organic light emitting array and serve as barriers to prevent permeation of exterior air or moisture injected from a lower part.

The first buffer layer 130 and the second buffer layer 220 include a plurality of inorganic films. For example, the inorganic films may be formed by continuously or alternatively laminating SiNx or $SiO_2$. It can be seen from experimentation that, when two or more layers are laminated to a thickness of about 5,000 Å to 6,500 Å as the first and second buffer layers 130 and 220, permeation of exterior air or moisture can be prevented. A total thickness of the first and second buffer layers 130 and 220 is 1 µm or less, which does not increase the thickness of the touchscreen-integrated display device.

The touch electrode array 230 includes a first transparent channel electrode (not shown) and a second transparent channel electrode (not shown) that intersect each other, and a touch pad (provided in a touch pad portion) to transfer a signal to the first and second transparent channel electrodes. A thin film transistor array including the dummy metal is shown in FIG. 3 and a touch electrode layer is shown in the form of a single layer including the touch pad, and the first and second transparent channel electrodes, but these layers are patterned according to respective electrodes.

Here, the first and second transparent channel electrodes are formed of a transparent electrode, the touch pad includes a metal pad layer that has high conductivity and superior light-shielding properties (the same layer as the metal bridge), and a transparent electrode pattern which is the same layer as the transparent electrode constituting the first and second transparent channel electrodes. Also, the first and second transparent channel electrodes may be disposed in the same layer or different layers. For example, when the first and second transparent channel electrodes are present in the same layer, a separate metal bridge that contacts the first transparent channel electrodes or the second transparent channel electrodes adjacent to other layers is provided at the intersection between the first and second transparent channel electrodes, to prevent short-circuit between the first and second transparent channel electrodes.

In the in-cell organic light emitting display described above, contact between the touch pad portion and the dummy pad portion formed in the thin film transistor array via conductive balls may be difficult or defective due to difference in diameter between conductive balls 455 or pressure applied during a bonding process, thus undesirably increasing resistance.

Figure 4:
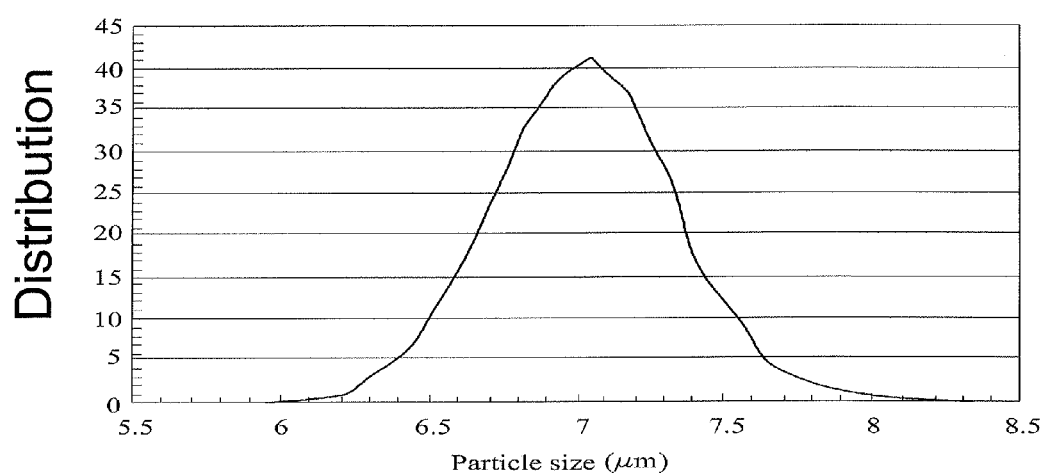
FIG. 4 is a graph showing distribution of conductive balls according to diameter.

FIG. 4 is a graph showing distribution of conductive balls according to diameter.

For example, conductive balls (particles) having a mean diameter of 7 μm, as shown in FIG. 4, may have a diameter distribution in the range of about 6 μm to 8 μm, due to manufacturing tolerance during the formation of conductive balls.

Figure 5:
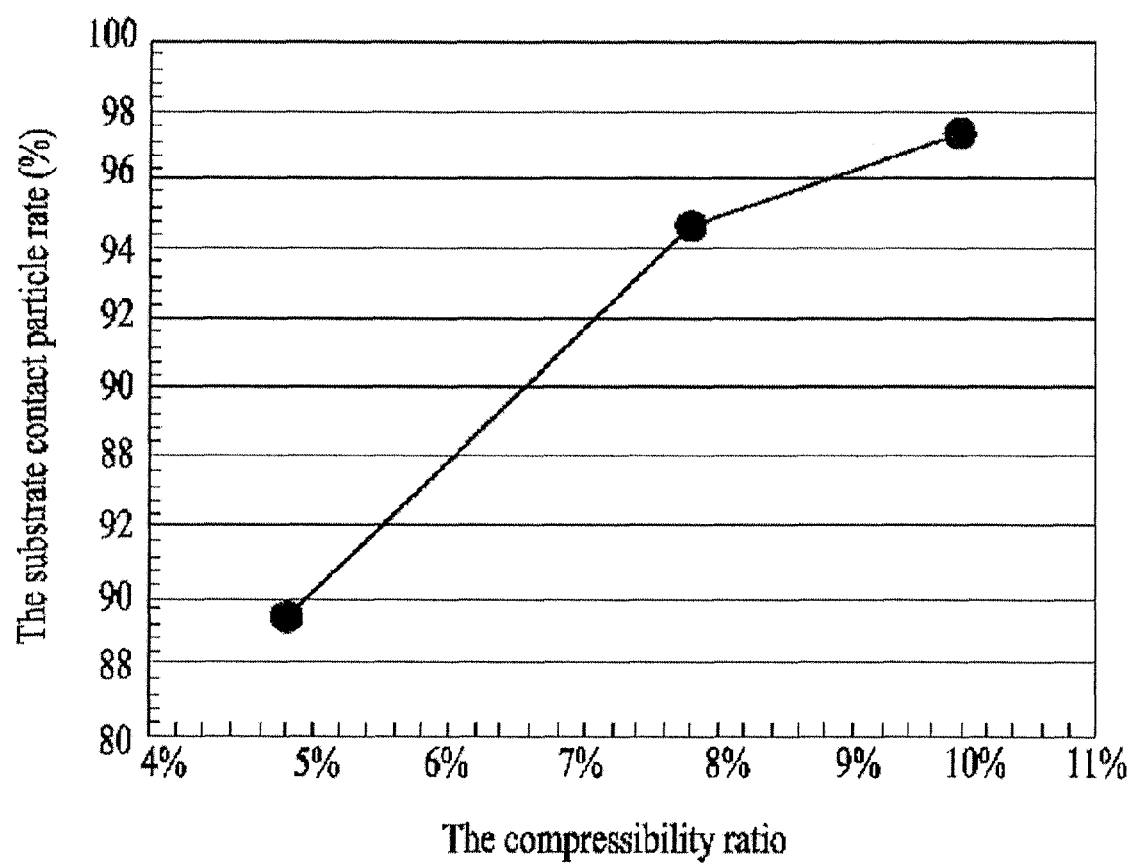
FIG. 5 is a graph showing a ratio of conductive balls contacting a substrate.
Figure 6:
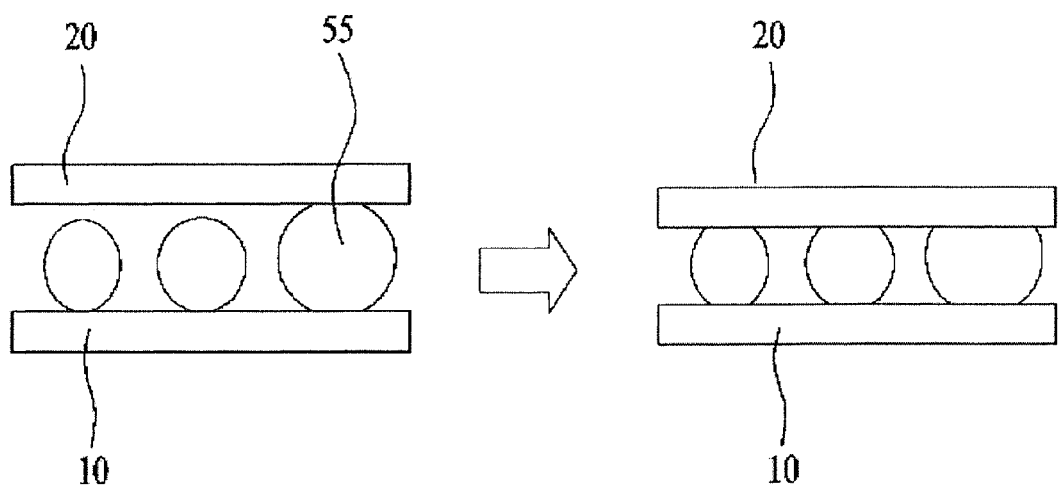
FIG. 6 is a graph showing a ratio of conductive balls contacting a substrate before and after compression when conductive balls have different diameters.

FIG. 5 is a graph showing a ratio of conductive balls contacting a substrate. FIG. 6 is a graph showing a ratio of conductive balls contacting a substrate before and after compression when there is a difference in diameter between conductive balls.

As can be seen from FIG. 6, the conductive balls are elastic and a contact area between the conductive balls and the substrate is thus varied depending on applied pressure. As the applied pressure increases, the contact area between the conductive balls and the substrate increases.

As can be seen from FIG. 6, in particular, when a plurality of conductive balls 55 having different diameters are formed on the substrate 10, if no pressure is applied to the substrate 10 or a counter substrate 20 disposed opposite to the substrate 10, only conductive balls having a large diameter contact the counter substrate 20. However, when a compressive force of 10% or more is applied thereto, conductive balls having a small diameter also contact the counter substrate 20.

This means that a predetermined pressure or more is required so that all conductive balls contact an opposite pad portion during the bonding process due to difference in diameter between the conductive balls. However, there is a limitation on arbitrary increase in applied pressure, since the pressure applied during bonding is predetermined and pattern stability in the active region should be considered.

Hereinafter, how to avoid contact defects through structural change in the organic light emitting display of the present disclosure will be described.

Figure 7:
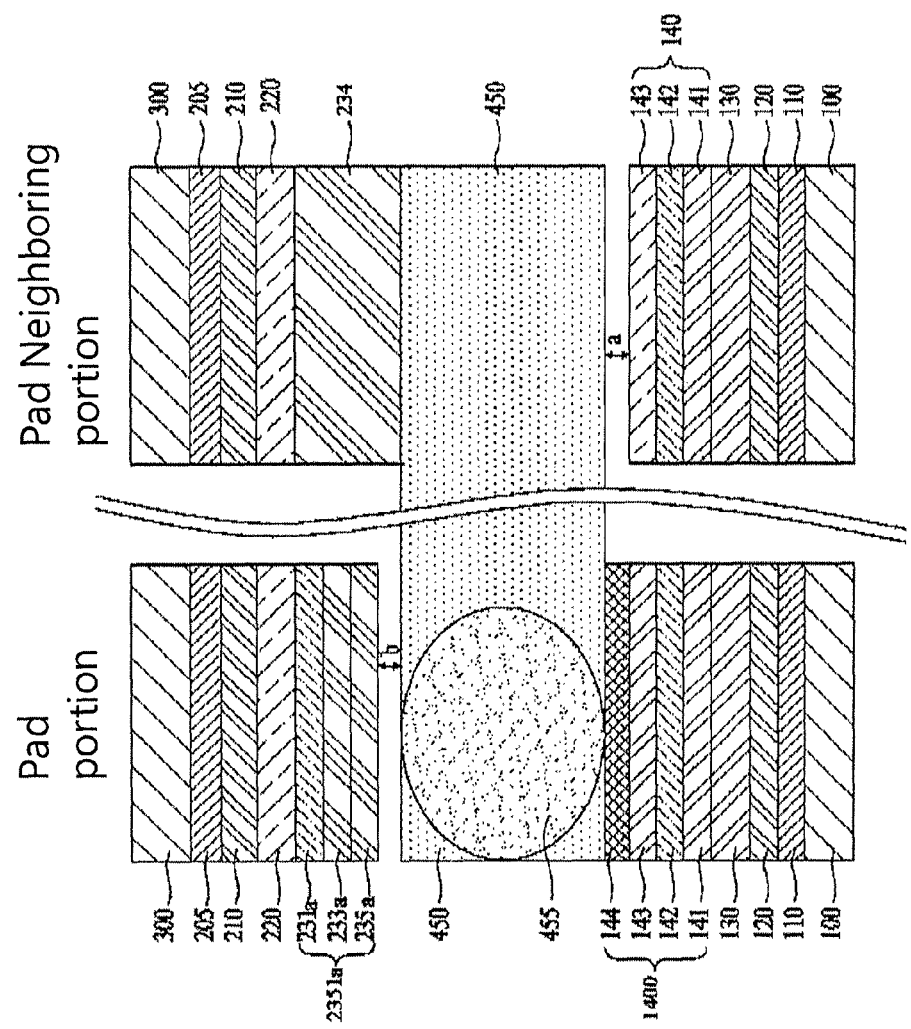
FIG. 7 is a cross-sectional view illustrating a bonding process in the pad and a pad neighboring portion of FIG. 2.

FIG. 7 is a cross-sectional view illustrating a bonding process in the pad and a pad neighboring portion of FIG. 2. FIG. 7 illustrates an organic light emitting display including an in-cell type touch electrode array according to one embodiment of the present invention. Considering the pad electrode and the pad electrode neighboring portion, a step between upper and lower parts occurs in a region corresponding to a sealant 450.

FIG. 7 illustrates a bonding process. The first and second substrates 100 and 300 made of a glass component remain un-removed on the rear surface of the first etching stopper film 120 and the second etching stopper film 210, respectively. That is, the bonding process is performed under the condition that the glass substrate is not removed. After the touch pad electrode is bonded to the dummy electrode of the thin film transistor array, the first and second substrates 100 and 300 are removed.

Regarding a substantial lamination order, an amorphous semiconductor layer 110, a first etching stopper film 120, a first buffer layer 130, a thin film transistor array 140 and an organic light emitting device array 150 are sequentially formed on the first substrate 100. In the drawing, excluding an active region, only the pad electrode portion and the pad electrode neighboring portion are present and the organic light emitting device array 150 is omitted.

As shown in FIG. 7, the touch pad electrode 2351*a* includes a metal pattern 231*a* in the same process as the metal bridge of the touch electrode array 230, and a transparent electrode pattern 233*a* and a common transparent electrode pattern 235*a* formed in the same process as the first and second transparent channel electrodes. That is, the touch pad electrode 2351*a* is formed by laminating a metal formed during three different processes and at least one transparent electrode pattern.

In this case, the pad electrode neighboring portion is not provided with an electrode and includes the second interlayer insulating film 234 in the active region. Also, the second interlayer insulating film 234 is an organic film.

In this regard, the metal pattern 231*a* has a thickness of about 1,000 to about 3,000 Å, and the transparent electrode pattern 233*a* and the common transparent electrode pattern 235*a* have a considerably small thickness of about 300 to about 800 Å and about 75 to about 250 Å, respectively. The thickness of the common transparent electrode pattern 2351*a* having a laminate structure including three layers is smaller than the thickness (2 to 3 μm) of the second interlayer insulating film 234 formed of an organic film 234. As a result, a distance "b" is present between the outermost surface of the touch pad electrode 2351*a* and the conductive ball 455 present in the sealant 450. This distance between the conductive ball 455 and the touch pad electrode 2351*a* may make electric contact between the pad electrode 2351*a* and the dummy electrode 1400 impossible.

Meanwhile, the dummy electrode 1400 includes a gate insulating film 141, a gate electrode layer 142, an intermediate insulating film 143 and a source metal layer 144 which are laminated on a first buffer layer 130.

The source metal layer 144 is removed from the neighboring portion of the dummy electrode 1400 to expose the intermediate insulating film 143. As a result, a distance "a" is present between the exposed intermediate insulating film 143 and the sealant 450.

However, as shown in FIG. 7, since the distance "b" between the afore-mentioned pad electrode 2351*a* and the sealant 450 is larger than the distance "a" due to the thickness of the second interlayer insulating film 234, the conductive balls 455 may be spaced from the pad electrode 2351*a* by applying a predetermined pressure, making the distance "a" zero. In this case, a contact defect occurs.

In the test of the present disclosure, when the second interlayer insulating film 234 has a thickness of about 2.1 μm, the metal pattern 231*a*, the transparent electrode pattern 233*a* and the common transparent electrode pattern 235*a* have thicknesses of 2000 Å, 500 Å and 125 Å, respectively, the distance "b" is an about 1.8 μm, and the distance "a" between the thin film transistor array 140 corresponding to the pad electrode neighboring portion and the sealant 450 is 3,000 Å, as a result of removal of the source metal layer 144. In this case, a pressure should be applied so that the conductive ball 445 is compressed to a thickness of 1.5 μm or more and thus contacts the dummy electrode 1400 and the touch pad electrode 2351*a*. Also, in consideration of difference between the conductive balls 445, a pressure should be applied so that each conductive ball is compressed to a thickness of 1.5 μm or more. When the pressure is insufficient, contact defects may occur in the structure shown in FIG. 7.

In this regard, there is a limitation on the amount of pressure applied during the bonding process. Accordingly, the organic light emitting display of the present disclosure improves electric contact between the conductive ball, and the pad electrode and the dummy electrode, and this configuration will be described in detail.

In the following drawings, the layers constituting the touch electrode array are not drawn to scale and are shown to have similar thicknesses. Generally, the interlayer insulating film has the largest thickness of about 1.5 μm to about 4 μm among the layers constituting the array and the metal layer has a thickness of about 2,000 Å to about 4,000 Å. The transparent electrode layer has a thickness of about 300 to about 800 Å, and the common transparent electrode layer has a thickness of about 75 to 250 Å. That is, the layers have different thickness. However, as shown in the drawings, the layers formed in common in the pad electrode, the pad electrode neighboring portion and the active region cause no step between regions and the respective layers are shown to have similar thickness.

Figure 8:
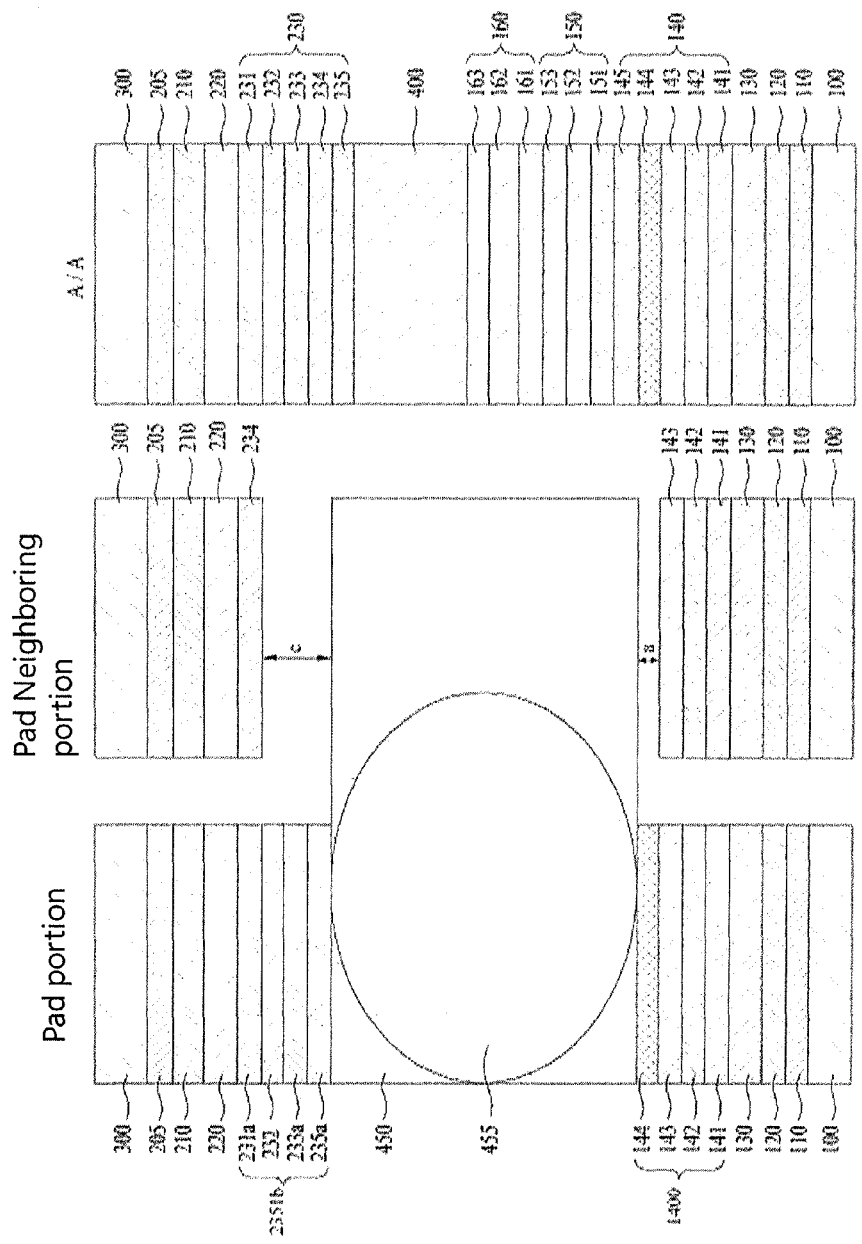
FIG. 8 is a cross-sectional view illustrating a pad, a pad neighboring portion and an active region of an organic light emitting display according to a first embodiment of the present disclosure.

FIG. 8 is a cross-sectional view illustrating a pad, a pad neighboring portion and an active region of an organic light emitting display according to a first embodiment of the present invention.

Figure 9:
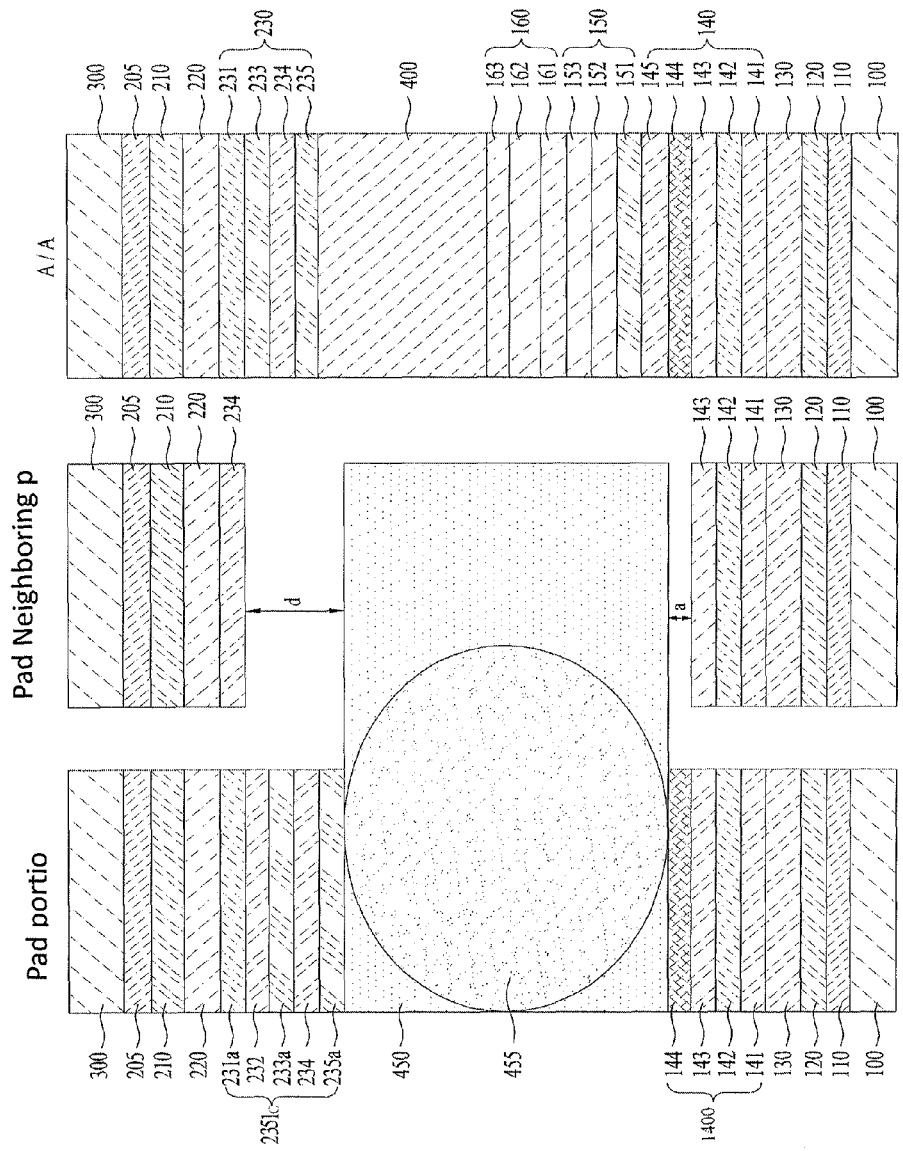
FIG. 9 is a cross-sectional view illustrating a pad, a pad neighboring portion and an active region of an organic light emitting display according to a second embodiment of the present disclosure.

A state immediately after bonding is shown in the cross-sectional views of FIGS. 8 and 9. The second substrate 300 and the first substrate 100 disposed in upper and lower parts still remain unremoved.

As shown in FIG. 8, the organic light emitting display according to the first embodiment of the present invention includes a first buffer layer 130 and a second buffer layer 220 which include an active region and a dead region and face each other, a thin film transistor array 140 including a thin film transistor in each of pixels defined in a matrix form in the active region of the first buffer layer 130, an organic light emitting array 150 including an organic light emitting diode connected to the thin film transistor of each pixel, a protective layer 160 formed on the first buffer layer 130 such that it covers the thin film transistor array 140 and the organic light emitting array 150, a touch electrode array 230 formed in the active region of the second buffer layer 220, an adhesive layer 400, the top and bottom of which contact the protective layer 160 and the touch electrode array 230, respectively, a touch pad portion (represented by "2350" in FIG. 2) formed in a predetermined part of the dead region of the second buffer layer 220, a dummy pad portion formed in the dead region of the first buffer layer 130 such that it faces the touch pad portion, and a sealant 450 including a plurality of conductive balls 455 positioned between the touch pad portion and the dummy pad portion.

Also, the touch pad portion includes a plurality of touch pads 2351b, and the dummy pad portion includes dummy electrodes 1400 corresponding to the touch pads 2351b.

Here, a distance between the uppermost surface of the touch pad electrode 2351b and the uppermost surface of the dummy electrode 1400 in the pad portion is smaller than the distance in the neighboring portion. In the drawing, the distance of the pad electrode is "a+c" smaller than that of the pad electrode neighboring portion.

In this case, the first distance "a" represents a distance between the sealant 450 and the thin film transistor array 140. The first distance "a" is formed as a result of removal of the source metal layer 144 from the pad electrode neighboring portion of the thin film transistor array 140. The second distance "c" represents a distance between the second interlayer insulating film 234 and the sealant 450 in the pad electrode neighboring portion.

In the first embodiment, a first interlayer insulating film 232 corresponding to the touch pad electrode is further provided, although the second interlayer insulating film 234 included in the pad electrode neighboring portion adjacent thereto is thicker than the metal layer or the transparent electrode layers. The first interlayer insulating film 232 having a similar thickness to the second interlayer insulating film 232 is also provided in the touch pad electrode 2351b. The touch pad electrode 2351b is thus formed to have a step higher than the neighboring portion.

That is, the touch pad portion includes a plurality of touch pad electrode 2351bs two-dimensionally spaced from one another. Each touch pad electrode 2351b further includes the first interlayer insulating film 232 interposed between the metal pattern 231a and the transparent electrode pattern 233a, in addition to the metal pattern 231a, the transparent electrode pattern 233a and the common transparent electrode pattern 235a, along a vertical direction, in order to increase the height of the step. In FIG. 7, only one first interlayer insulating film 232 is interposed between the electrode layer and the transparent electrode pattern, but the present disclosure is not limited to this structure. That is, two or more interlayer insulating films can be further provided to maximize a step between the pad electrode and the pad electrode neighboring portion. Here, the interlayer insulating film included in the touch pad electrode 2351a may be formed during formation of the touch electrode array 230, which is a component that may be formed without an additional process.

Here, only a part of the touch pad electrode 2351b is shown. A contact hole is provided in a part of the first interlayer insulating film 232 between the metal pattern 231a and the transparent electrode pattern 233a, thus enabling electric contact.

Meanwhile, the dummy electrode 1400 has a configuration in which a gate insulating film 141, a gate electrode layer 142, an intermediate insulating film 143 and a source metal layer 144 are laminated in this order on the first buffer layer 130.

The conductive ball 455 in the sealant 450 is connected to the upper and lower touch pads 2351b and the dummy electrode 1400 even upon application of low pressure during the bonding process, since the touch pad neighboring portion has an "a+c" greater distance than the touch pad, thus improving contact characteristics. As a result, after the bonding process, the conductive ball 455 is pressed to a predetermined thickness between the touch pad portion and the dummy pad portion. This structure causes a decrease in contact resistance, improvement in contact characteristics and thus improvement in touch signal sensitivity.

In this case, a second distance "c" is present between the second interlayer insulating film 234 and the sealant 450 in the dead region of the touch pad portion neighboring portion, and a first distance "a" is present between the intermediate insulating film 143 and the sealant 450 in the dummy electrode neighboring portion.

Meanwhile, one or more interlayer insulating films 234 and 232 are preferably organic films. This aims at providing interlayer insulation between the electrode layer and the transparent electrode pattern in the touch electrode array 230 and securing a predetermined thickness between the metal layer and the transparent electrode pattern which are different layers.

A flat layer 145 may be further provided on the outermost surface of the thin film transistor array 140 in the active region.

Also, the touch electrode array 230 of the active region includes the metal bridge 231 formed in the same layer as the metal pad layer 231a on the second buffer layer, a plurality of first transparent channel electrodes (represented by "2331" in FIG. 10) which are electrically connected to the metal bridge 231 while overlapping the metal bridge 231 and are spaced from one another in a first direction in the same layer as the transparent electrode pattern 233a, and a transparent metal layer 233 that includes a second transparent channel electrode 2332 that traverses the metal bridge and is formed in a second direction in the same layer as the first transparent channel electrode.

In the illustrated drawing, a common transparent electrode 235 overlaps the transparent metal layer 233 and the second interlayer insulating film 234 constituting the first and second transparent channel electrodes. If desired, the common transparent electrode 235 may be omitted. The common transparent electrode 235 is a floating state which functions to shield effects of driving signals of the thin film transistor array or the organic light emitting array that faces the same on the touch electrode array 230.

In this case, the touch pad 2351a of the touch pad portion may also further include a common transparent electrode pattern 235a that overlaps the transparent electrode pattern 233a and is connected to the transparent electrode pattern 233a.

Here, in the dead region of the touch pad portion neighboring portion, at least one interlayer insulating film (in the drawing, first interlayer insulating film) may be removed.

Meanwhile, reference numeral "145" represents a passivation layer 145 formed on the outermost surface of the thin film transistor array 140 in the active region.

Also, the organic light emitting array 150 includes an anode 151, an organic light emitting layer 152 and a cathode 153. This configuration is a minimal unit. A bank (not shown) may be included between pixels in order to isolate the organic light emitting layer 152 into pixel units, and an organic layer may be added or changed in order to improve luminous efficacy between the anode 151 and the cathode 153.

Also, first and second etching stopper films 120 and 210 may be formed on the bottom of the first buffer layer 130 and the second buffer layer 220, respectively. The first etching stopper film 120 and the second etching stopper film 210 may be polyimide or photoacryl.

In this case, after the bonding process, a film substrate (represented by "1000" in FIG. 2) may be further formed on the bottom of the first etching stopper film 120. Here, the film substrate 1000 may be formed of a plastic insulating film for realization of thinness and flexibility.

Also, after removal of the substrate (glass), a cover glass (represented by "3000" in FIG. 2) may be further formed on the second etching stopper film 210.

Meanwhile, the first buffer layer 130 and the second buffer layer 220 may have a laminate structure including a plurality of inorganic films.

Also, the protective layer 160 includes an inorganic film 161, an organic film 162 and an inorganic film 163 which are laminated in this order. Based on the structure including organic and inorganic films which are alternately laminated, the protective layer 160 primarily functions to prevent permeation of moisture into the organic light emitting array 150.

Also, reference numerals "205" and "110" represent a nitride layer and an amorphous semiconductor layer, respectively, to protect arrays. These layers may be removed together with the adjacent substrate during removal of the glass after the bonding process.

Hereinafter, a second embodiment of the present invention will be described.

FIG. 9 is a cross-sectional view illustrating a pad, a pad neighboring portion and an active region of an organic light emitting display according to a second embodiment of the present invention.

In comparison with the first embodiment, the organic light emitting display according to the second embodiment is characterized in that the pad electrode further includes a second interlayer insulating film 234 between the transparent electrode pattern 233a and the common transparent electrode pattern 235a overlapping the transparent electrode pattern 233a.

In this case, in comparison with the pad electrode neighboring portion, the pad electrode further includes the metal pattern 231a, the second interlayer insulating film 232, the transparent electrode pattern 233a and the common transparent electrode pattern 235a. The total thickness of these layers in the pad electrode corresponds to a third distance "d" and thus is higher than the pad electrode neighboring portion. Accordingly, as compared to the first embodiment, the second embodiment exhibits superior contact properties between the touch pad electrode 2351a of the conductive ball 455 and the dummy electrode 1400 after bonding.

Also, the first interlayer insulating film 232 is omitted in the active region and a step of the uppermost surface of the active region can thus be decreased. In this case, when the protective layer 160 covering the organic light emitting array 150 contacts the dummy pad electrode 1400 through the sealant 450 including the adhesive layer 400 and the conductive balls 455, the touch pad electrode 2351a having a higher step can easily contact the sealant 455, as compared to other regions and thus exhibits improved contact properties.

Regardless of whether the first interlayer insulating film 232 is removed from the active region, the touch pad electrode neighboring portion has a lower step than the touch pad electrode and thus exhibits improved contact properties.

When the first interlayer insulating film 232 is removed from the active region, the first metal bridge 231 provided with the thin film transistor array 140 directly contacts the first transparent channel electrode of the transparent electrode layer 233. In this case, in order to prevent short-circuit between the first metal bridge 231 and the first transparent channel electrode, the first interlayer insulating film 232 may be provided on the first metal bridge 231 excluding a contact site between first transparent channel electrodes disposed at both sides of the first metal bridge 231.

Hereinafter, a modified embodiment of the second embodiment and a detailed description thereof will be described.

Figure 10:
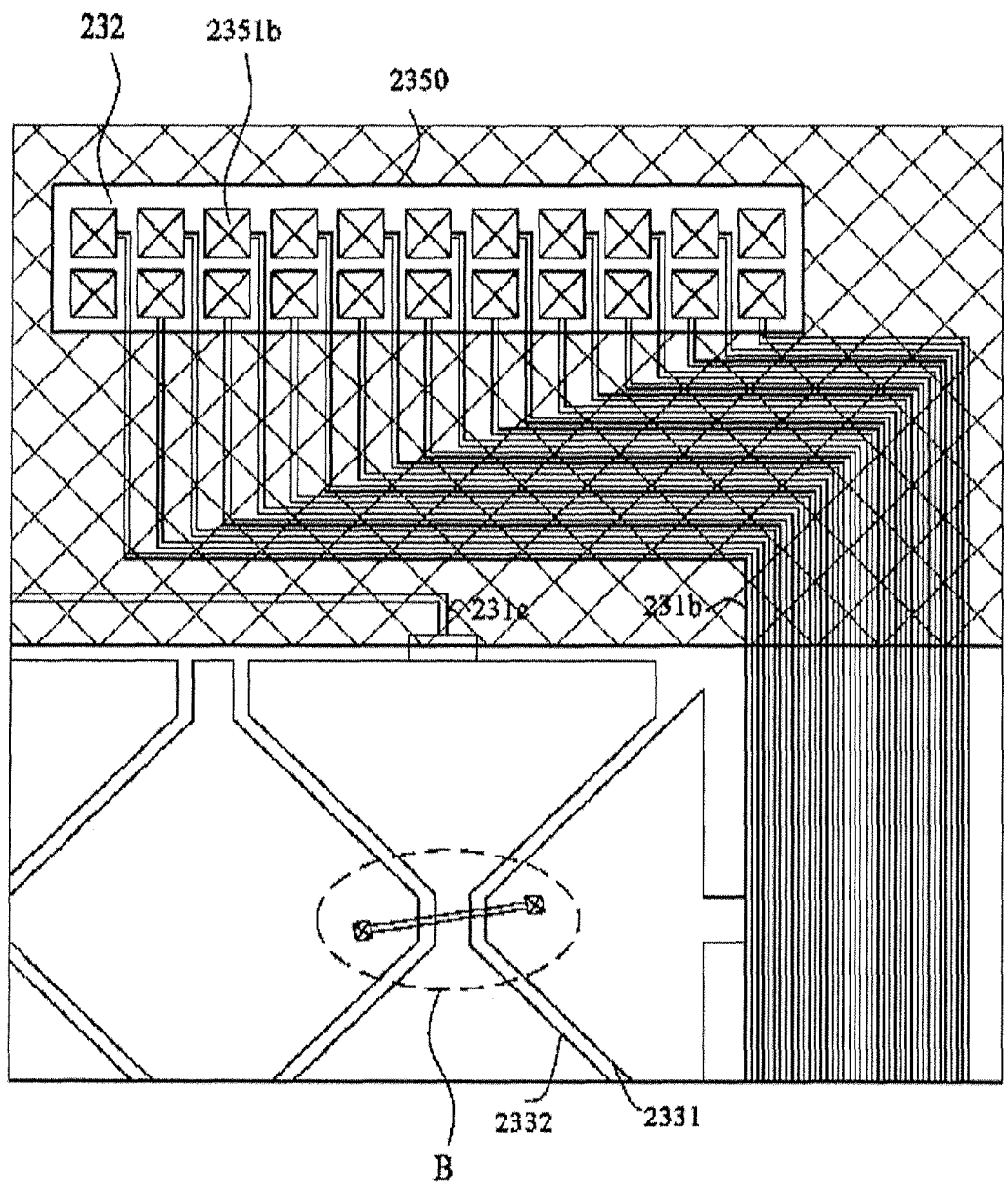
FIG. 10 is a plan view illustrating a region "A" of FIG. 2 according to a modified embodiment of the second embodiment.
Figure 11A:
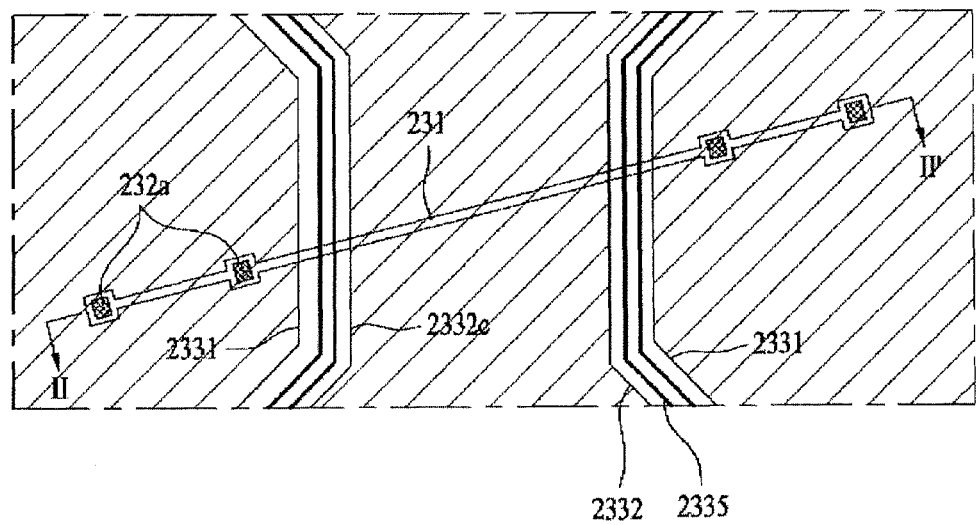
FIGS. 11A and 11B are an enlarged plan view and a sectional view illustrating a region "B" of FIG. 10, respectively.
Figure 11B:
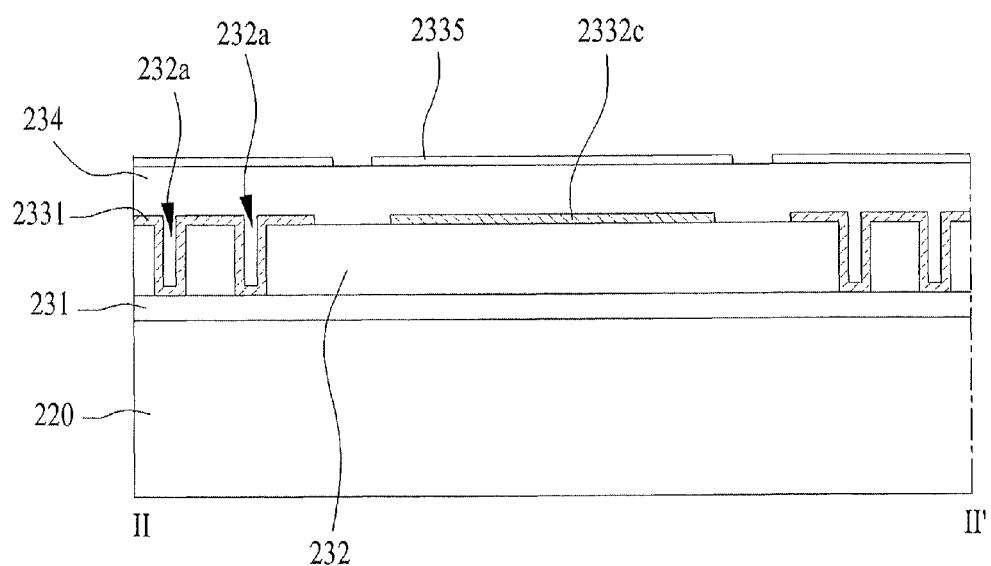

FIG. 10 is a plan view illustrating a region "A" of FIG. 2 according to a modified embodiment of the second embodiment. FIGS. 11A and 11B are an enlarged plan view and a cross-sectional view illustrating a region "B" of FIG. 10, respectively.

The modified embodiment of the second embodiment according to the present disclosure illustrates a configuration in which the first interlayer insulating film 232 is omitted in the neighboring portion of the touch pad portion 2350. That is, the first interlayer insulating film 232 is formed in the active region and the touch pad portion 2350.

Specifically, referring to FIG. 11A which is an enlarged view of a region "B" of FIG. 10, the metal bridge 231 of the active region is shown. Also as shown in FIG. 11B, first transparent channel electrodes 2331 are spaced from one another in an island form. A second transparent channel electrode connection portion 2332c between first transparent channel electrodes 2331 is disposed in a vertical direction. A second transparent channel electrode 2332 has a diamond shape integrated therewith.

Here, the first transparent channel electrode 2331, the second transparent channel electrode 2332 and the second transparent channel electrode connection portion 2332c are formed by patterning the transparent electrode layer disposed in the same layer. The first transparent channel electrode 2331 is connected to the metal bridge 231 through a contact hole 232a interposed between the first interlayer insulating film 232 and the metal bridge 231.

Also, the second interlayer insulating film 234 that covers the first transparent channel electrode 2331, the second transparent channel electrode connection portion 2332c and the second transparent channel electrode 2332 is formed. A common transparent electrode 2335 having a width larger than the first transparent channel electrode 2331 and the second transparent channel electrode 2332 and the second transparent channel electrode connection portion 2332c integrated with each other is formed on the second interlayer insulating film 234.

Here, the common transparent electrode 2335 is not connected to the pad electrode and is provided as a floating state which functions to shield effects of driving of the organic light emitting array disposed thereunder, when the touch electrode array and the organic light emitting array are joined to each other using an adhesive layer 400. If desired, the common transparent electrode 2335 may be omitted.

As shown in FIG. 10, reference numeral "231b" represents a routing line formed together with the metal bridge 231 and is a line to transfer a signal between the first transparent channel electrode 2331 and the touch pad electrode 2351b of each line. Reference numeral "231c" also represents a line formed in the same layer as the metal bridge 231 and the second substrate (removed after bonding), the second transparent channel electrode 2332 of each row and the touch pad electrode (2351b, provided in a touch pad portion formed at one side of the substrate, based on FIG. 2).

Figure 12:
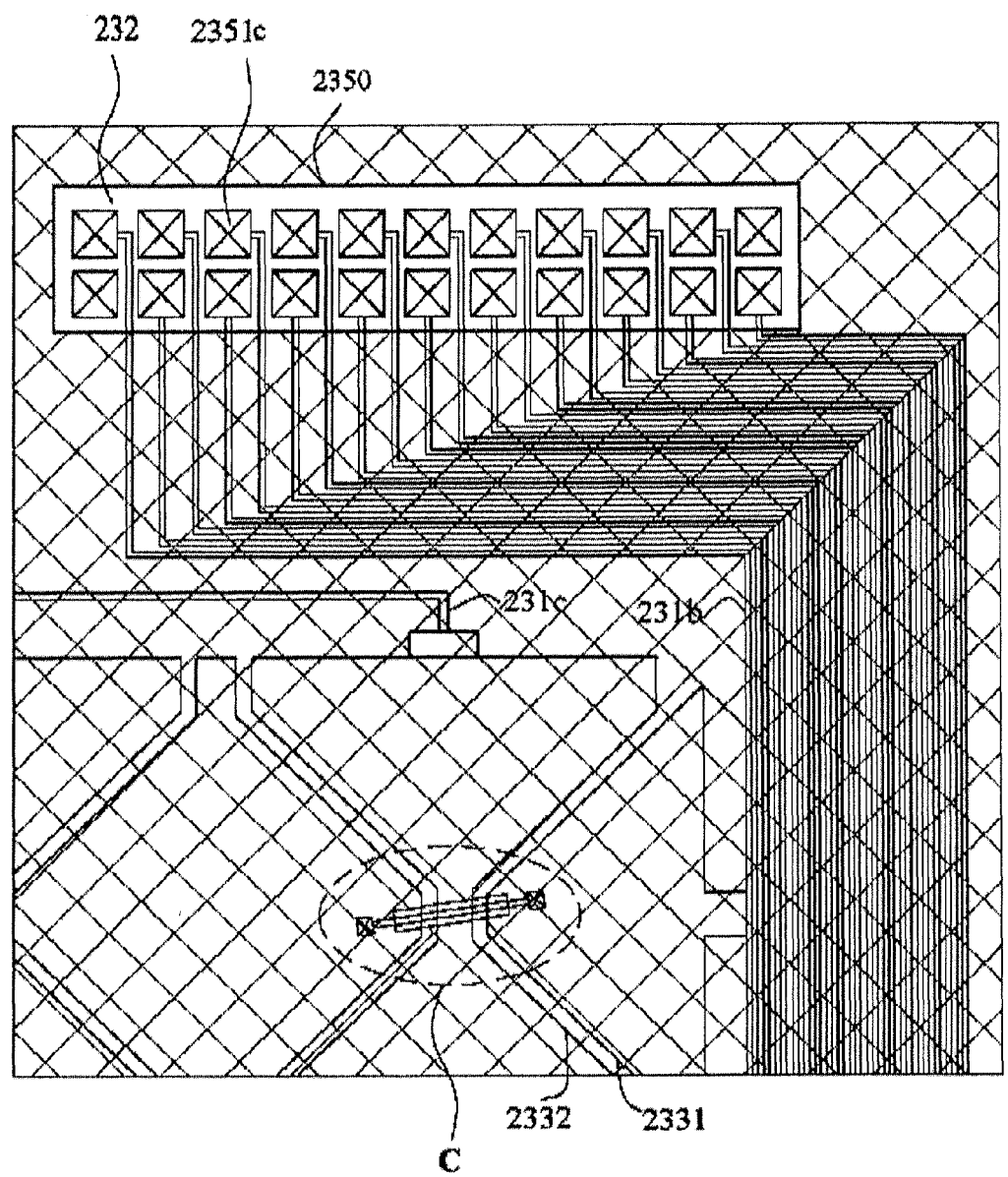
FIG. 12 is a plan view illustrating a region "A" according to the second embodiment of the present disclosure.
Figure 13A:
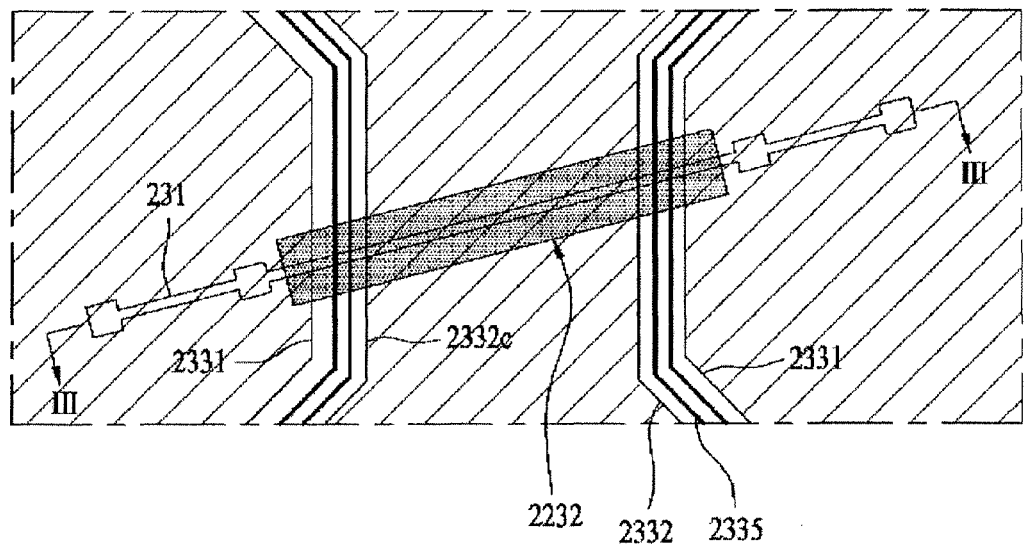
FIGS. 13A and 13B are an enlarged plan view and a sectional view of a region "C" of FIG. 12, respectively.
Figure 13B:
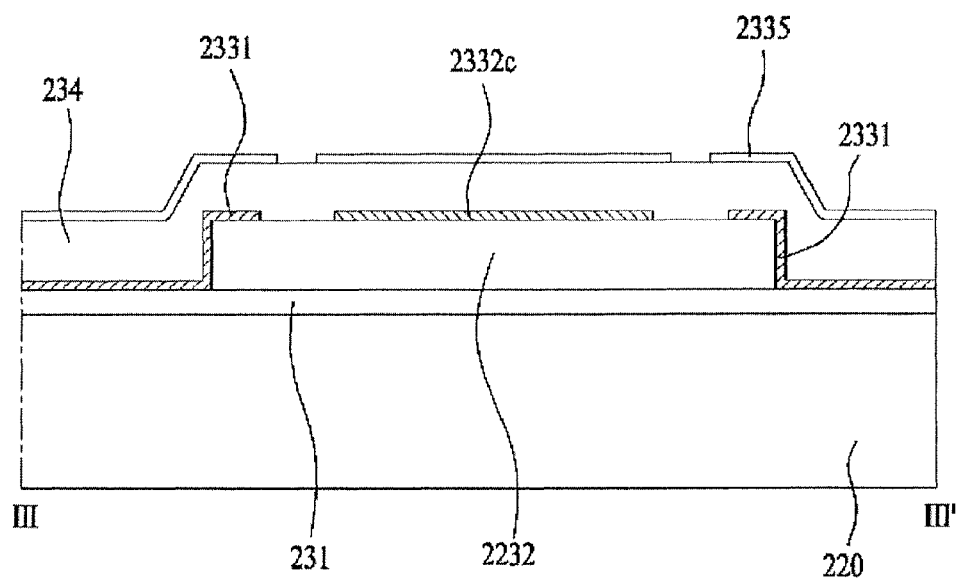

FIG. 12 is a plan view illustrating a region "A" according to the second embodiment of the present invention. FIGS. 13A and 13B are an enlarged plan view and a cross-sectional view of a region "C" of FIG. 12, respectively.

As shown in FIGS. 12 to 13B, according to the second embodiment of the present invention, the first interlayer insulating film 232 is removed from the active region, excluding a region where the second transparent channel electrode connection portion 2332c overlaps the metal bridge 231. In this case, the contact hole is not provided in the first interlayer insulating film 232 and directly contacts the first transparent channel electrode 2331 at both sides of the metal bridge 231.

Also, the first interlayer insulating film 2232 is selectively formed only in regions where the touch pad portion 2350 overlaps the metal bridge 231.

Accordingly, as shown in FIG. 13B, due to selective omission of the first interlayer insulating film 2332, the top of the first transparent channel electrode 2331 (the top of the second transparent channel electrode 2332 has a lower step) has a lower step than the central region of the metal bridge 231.

Also, the first interlayer insulating film 2232 is omitted from the active region and the step of the outermost surface of the active region can thus be lowered. In this case, when a protective layer 160 covering the organic light emitting array 150 contacts the dummy pad electrode 1400 through the sealant 450 including the adhesive layer 400 and the conductive ball 455, the touch pad electrode 2351c in the touch pad portion 2350 having a relatively high step contacts the conductive ball 455 of the sealant and contact properties can thus be improved.

Hereinafter, with reference to FIGS. 2, 3, 8, 10, 11A and 11B, a method for fabricating the organic light emitting display of the present disclosure will be described.

First, an amorphous semiconductor layer 110, a first etching stopper film 120 and a first buffer layer 130 are formed on a first substrate 100, a thin film transistor array 140 including a thin film transistor in each of pixels defined as a matrix form, an organic light emitting array 150 including an organic light emitting diode connected to the thin film transistor of each pixel, and a protective layer 160 formed on the first buffer layer 130 such that it covers the thin film transistor array 140 and the organic light emitting array 150 are formed in the active region of the first buffer layer 130. A dummy pad portion including a plurality of dummy pads 1400 spaced from one another is formed in a part of the dead region of the first buffer layer 130.

Subsequently, a nitride film 205, a second etching stopper film 210 and a second buffer layer 220 are formed on a second substrate 300, the touch electrode array 230 is formed in the active region of the second buffer layer 220, and a touch pad portion 2350 including a plurality of touch pad electrodes (2351b or 2351c) spaced from one another are formed in a region corresponding to the dummy pad portion. In this process, the configuration is designed such that the distance between the outermost surface of the touch pad portion 2350 and the outermost surface of the dummy pad portion is smaller than that of the neighboring portion.

Subsequently, a sealant 450 including conductive balls 455 is applied to the touch pad portion 2350 or dummy pad portion and an adhesive layer 400 is applied to the touch electrode array 230 or the protective layer 160 and a joining process is performed. During the joining process, the distance between the outmost surface of the touch pad portion 2350 and the dummy pad portion of the pad electrode portion is smaller than that of the neighboring portion, making connection between upper and lower pad portions through conductive balls sufficient.

In this case, after joining, the conductive balls may be pressed to a predetermined thickness between the touch pad portion and the dummy pad portion.

Also, after the joining process, the dead region of the touch pad portion neighboring portion may be spaced from the sealant by a predetermined distance.

Also, after the joining process, the method may further include removing the first substrate 100 and the second substrate 300 and adhering a film substrate 1000 via a film adhesion layer 1100 to the exposed surface of the first etching stopper film 120.

Here, the first substrate 100 and the second substrate 300 may be removed by etching or laser-irradiating the first substrate 100 and the second substrate 300.

Hereinafter, Tables 1 to 4 show pressing levels of conductive balls of the configurations of FIGS. 7, 8 and 9 and a modified embodiment of the second embodiment, a configuration shown in FIGS. 10 to 11B.

Total numbers of conductive balls (AuB) used for structures of respective embodiments are different. A share of a pressing level with respect to a total number of conductive balls for respective embodiments is important. As shown in FIGS. 3 to 5, contact properties are improved depending on pressing level. That is, when a thickness, to which conductive balls are pressed, increases, contact properties are improved.

In the following test, the diameter of the conductive balls is about 50 μm.

TABLE 1

| Conditions | AuB pressing range (um) | The number of AuB (EA) | Share (%) | Total number of AuB (EA) |
|---|---|---|---|---|
| Structure of FIG. 7 | 10 or less | 887 | 70 | 1263 |
|  | 10 to 15 | 128 | 10 |  |
|  | 16 to 20 | 204 | 16 |  |
|  | 20 or more | 44 | 3 |  |

As can be seen from Table 1 above, in the configuration shown in FIG. 7, a diameter range of conductive balls having the highest share of 70% among conductive balls is 10 μm or less.

TABLE 2

| Conditions | AuB pressing range (um) | The number of AuB (EA) | Share (%) | Total number of AuB (EA) |
|---|---|---|---|---|
| First embodiment | 10 or less | 188 | 31 | 609 |
|  | 10 to 15 | 131 | 22 |  |
|  | 16 to 20 | 207 | 34 |  |
|  | 20 or more | 83 | 14 |  |

As compared to the structure of FIG. 7 shown in Table 1 above, the first embodiment shown in FIG. 8 has a decreased share at 10 μm or less of 31%, and increased pressing levels at 10 to 15 μm, 16 to 20 μm, and 20 μm or more. This means considerable improvement in pressing properties in all cases. Here, a share at 10 μm or less of 31% is caused by difference in diameter between the conductive balls. When taking into consideration the fact that a plurality of conductive balls correspond to each pad electrode, contact defects can be prevented and contact resistance can be improved.

TABLE 3

| Conditions | AuB pressing range (um) | The number of AuB (EA) | Share (%) | Total number of AuB (EA) |
|---|---|---|---|---|
| Second embodiment | 10 or less | 98 | 25 | 397 |
|  | 10 to 15 | 25 | 6 |  |
|  | 16 to 20 | 89 | 22 |  |
|  | 20 or more | 185 | 47 |  |

As can be seen from FIG. 9, the second embodiment exhibits better pressing properties than the first embodiment. A pressing range having the highest share is 0 μm or more and has a share of about 47%. Also, a pressing level of 10 μm or less is 25% or less, the conductive balls of the second embodiment exhibit better contact properties than those of the aforementioned first embodiment.

TABLE 4

| Conditions | AuB pressing range (um) | The number of AuB (EA) | Share (%) | Total number of AuB (EA) |
|---|---|---|---|---|
| Modified embodiment of second embodiment | 10 or less | 248 | 26 | 956 |
|  | 10 to 15 | 202 | 21 |  |
|  | 16 to 20 | 334 | 35 |  |
|  | 20 or more | 172 | 18 |  |

As shown in Table 4, the modified embodiment of the second embodiment exhibits a pressing level of 10 μm or less of 26% or less which is similar to the second embodiment and conductive balls of the modified embodiment exhibit better than those of the first embodiment.

That is, as can be seen from these tests, according to the embodiments of the present invention, when the touch pad electrode has a higher step or the active region and the neighboring portion of touch pad electrode has a lower step, a pressing level of conductive balls increases, contact properties between upper and lower pad portions are improved and contact resistance is reduced.

This structure in which the touch pad electrode has a higher step than the neighboring portion improves contact properties and thus in-cell performance.

The organic light emitting display of the present disclosure and the method for manufacturing the same have the following advantages.

First, by changing a vertical configuration of the touch pad portion or the neighboring portion in an in-cell structure having a touch electrode array inside a cover glass, a distance between the touch pad portion and the thin film transistor array pad portion is decreased, as compared to a distance between other region and the thin film transistor array pad portion, and conductive balls thus contact upper and lower pad portions within a sufficiently decreased distance although there is a difference in diameter between conductive balls.

Second, a vertical distance between the touch pad portion and the thin film transistor array pad portion is decreased and compression properties of conductive balls during the bonding process can thus be improved. Accordingly, contact resistance is reduced and an in-cell structure with excellent touch sensitivity can thus be realized.

Third, since the touch pad portion is provided on an inner surface of the cover glass, the touch pad portion is connected to the thin film transistor pad portion through conductive balls. All of the touch electrode array, the thin film transistor array, and the organic light emitting array can transfer signals through one chip included in the thin film transistor pad portion. One chip is connected to one flexible printed board, thus simplifying a pad portion and circuit configurations of the organic light emitting display. As a result, slimness and cost reduction can be realized.

Fourth, the organic light emitting display according to the present disclosure has an in-cell structure in which the touch electrode array is directly formed on an inner surface of the cover glass, thus requiring no additional process for attaching a touch screen, enabling slimness and realizing displays manufactured in a simple process.

Fifth, a thin film transistor array and an organic light emitting array are formed on a first glass substrate, a touch electrode array is formed on a second glass substrate and the organic light emitting display array is joined to the touch electrode array such that these arrays face each other. Then, hard glass substrates at both sides are removed, and a plastic film is attached to one side of an exposed surface, thus resulting in thinness and flexibility of displays. Displays can have a reduced thickness and increased flexibility by omitting the glass substrate having the highest thickness.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display comprising:
a first buffer layer and a second buffer layer, each having an active region and a dead region and facing each other;
a thin film transistor array including a thin film transistor in each of a plurality of pixels defined in a matrix form on the active region of the first buffer layer;
an organic light emitting diode connected to each thin film transistor at each pixel;
a touch electrode array formed on the active region of the second buffer layer;
a touch pad portion formed on a part of the dead region of the second buffer layer;
a dummy pad portion facing the touch pad portion on the dead region of the first buffer layer; and a sealant including a plurality of conductive balls between the touch pad portion and the dummy pad portion,
wherein a distance between the outermost surface of the touch pad portion and the outermost surface of the dummy pad portion is smaller than a distance between outermost surfaces of neighboring portions adjacent to the touch pad portion and the dummy pad portion.

2. The organic light emitting display according to claim 1, wherein the touch pad portion comprises a plurality of touch pad electrodes spaced from one another, and
wherein the dummy pad portion comprises a plurality of dummy electrodes corresponding to the touch pad electrodes.

3. The organic light emitting display according to claim 2, wherein the touch pad electrode has a laminate structure comprising: a metal pattern; a transparent electrode pattern overlapping the metal pattern; and at least one interlayer insulating film disposed between the metal pattern and the transparent electrode pattern.

4. The organic light emitting display according to claim 3, wherein at least one interlayer insulating film is an organic film.

5. The organic light emitting display according to claim 4, wherein at least one interlayer insulating film is removed from the dead region of at least one of the neighboring portions.

6. The organic light emitting display according to claim 3, wherein the touch electrode array comprises:
a metal bridge formed in the same layer as the metal pattern on the second buffer layer;
a plurality of first transparent channel electrodes electrically connected to the metal bridge while overlapping the metal bridge in the same layer as the transparent electrode pattern, the first transparent channel electrodes being spaced in a first direction; and
a second transparent channel electrode formed in a second direction while traversing the metal bridge in the same layer as the first transparent channel electrode.

7. The organic light emitting display according to claim 6, wherein the touch pad electrode further comprises a common transparent electrode pattern that is connected to the transparent electrode pattern and overlaps the same.

8. The organic light emitting display according to claim 7, further comprising a common transparent electrode in the same layer as the common transparent electrode pattern such that the common transparent electrode covers the first transparent channel electrode and the second transparent channel electrode.

9. The organic light emitting display according to claim 8, further comprising a first interlayer insulating film between the metal bridge and a layer of the first transparent channel electrode and the second transparent channel electrode; and
a second interlayer insulating film formed between the common transparent electrode and the layer of the first transparent channel electrode and the second transparent channel electrode.

10. The organic light emitting display according to claim 9, wherein the first interlayer insulating film is removed from a region excluding the metal bridge intersecting the second transparent electrode channel, and the touch pad electrode.

11. The organic light emitting display according to claim 2, wherein the dummy electrode comprises a gate insulating film, a gate electrode layer, an intermediate insulating film and a source metal layer laminated on the first buffer layer.

12. The organic light emitting display according to claim 1, wherein the conductive balls are compressed to a predetermined thickness between the touch pad portion and the dummy pad portion.

13. The organic light emitting display according to claim 12, wherein the neighboring portions oppose each other and at least one of the neighboring portions is spaced from the sealant by a predetermined distance.

14. The organic light emitting display according to claim 1, further comprising a first etching stopper and a second etching stopper film formed on back surfaces of the first buffer layer and the second buffer layer, respectively.

15. The organic light emitting display according to claim 14, further comprising a film substrate formed on a back surface of the first etching stopper film.

16. The organic light emitting display according to claim 15, wherein the film substrate is a plastic insulating film.

17. The organic light emitting display according to claim 14, further comprising a cover glass formed on a back surface of the second etching stopper film.

18. The organic light emitting display according to claim 14, wherein the first etching stopper film and the second etching stopper film comprise polyimide or photoacryl.

19. The organic light emitting display according to claim 1, wherein the first buffer layer and the second buffer layer have a laminate structure including a plurality of inorganic films.

20. An organic light emitting display comprising:
a first buffer layer and a second buffer layer facing each other;
a touch pad portion disposed on the second buffer layer;
a dummy pad portion facing the touch pad portion and disposed on the first buffer layer;
a first neighboring portion disposed on the first buffer layer and adjacent to the dummy pad portion;
a second neighboring portion disposed on the second buffer layer and adjacent to the touch pad portion; and
a sealant including a plurality of conductive balls disposed between the touch pad portion and the dummy pad portion,
wherein a distance between the dummy pad portion and the touch pad portion is less than a distance between the first and second neighboring portions.

21. The organic light emitting display according to claim 20, wherein the touch pad portion extends a first height from the second buffer layer toward the sealant, the second neighboring portion extends a second height from the second buffer layer toward the sealant, and the first height is greater than the second height.

22. The organic light emitting display according to claim 20, wherein the second neighboring portion includes an insulating film.

23. The organic light emitting display according to claim 20, further comprising a thin film transistor array disposed on the first buffer layer.

24. The organic light emitting display according to claim 20, further comprising an organic light emitting array on the thin film transistor array.

25. The organic light emitting display according to claim 24, further comprising a protective layer that covers the thin film transistor array and the organic light emitting diode.

* * * * *